(12) United States Patent
Fann et al.

(10) Patent No.: US 8,748,796 B2
(45) Date of Patent: Jun. 10, 2014

(54) INTERACTIVE DISPLAY PANEL HAVING TOUCH-SENSING FUNCTIONS

(75) Inventors: Sen-Shyong Fann, Taipei County (TW); Nae-Jye Hwang, Hsinchu (TW); Shen-Tai Liaw, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 859 days.

(21) Appl. No.: 12/939,178

(22) Filed: Nov. 4, 2010
(Under 37 CFR 1.47)

(65) Prior Publication Data

US 2011/0069038 A1    Mar. 24, 2011

Related U.S. Application Data

(60) Continuation-in-part of application No. 12/406,337, filed on Mar. 18, 2009, now Pat. No. 7,935,917, which is a division of application No. 11/534,680, filed on Sep. 25, 2006, now Pat. No. 7,525,078.

(30) Foreign Application Priority Data

Oct. 7, 2005   (TW) ................................ 94135169 A

(51) Int. Cl.
*G01J 1/36* (2006.01)
*G06M 7/00* (2006.01)
*H01J 40/14* (2006.01)
*H03K 17/78* (2006.01)

(52) U.S. Cl.
USPC ........... 250/214 R; 250/214 SW; 250/227.22; 250/221

(58) Field of Classification Search
USPC ......... 345/156, 173–183, 158–160, 163, 166; 200/512, 217; 250/208.1, 208.2, 216, 250/221, 214 R, 214 SW, 214.1, 227.11, 250/227.13, 227.14, 227.18, 227.21, 250/227.22; 340/407.1, 407.2; 315/149–151, 155; 349/12, 41–48, 57, 349/139, 140, 142–148
See application file for complete search history.

(56) References Cited

U.S. PATENT DOCUMENTS 4,684,801 A   8/1987   Carroll et al.
4,988,983 A   1/1991   Wehrer
(Continued)

FOREIGN PATENT DOCUMENTS

EP   0679869   11/1995
EP   1195576   6/2008
(Continued)

OTHER PUBLICATIONS

"First Office Action of Europe counterpart application" issued on Sep. 27, 2013, p. 1-p. 11.
(Continued)

*Primary Examiner* — Pascal M Bui Pho
(74) *Attorney, Agent, or Firm* — Jianq Chyun IP Office

(57) ABSTRACT

An interactive display panel includes scan lines, first data lines, sub-pixels, photo-sensors and second data lines. The scan lines and the first data lines are intersected to define sub-pixel regions. Each of the sub-pixels is located in one of the sub-pixel regions and has a display region, and each of the sub-pixels is electrically connected with one of the scan lines and one of the first data lines respectively. The photo-sensors are located outside the display regions of the sub-pixels. The scan lines and the second data lines are intersected and electrically connected with the photo-sensors.

16 Claims, 16 Drawing Sheets

(56) References Cited

U.S. PATENT DOCUMENTS

| | | | |
|---|---|---|---|
| 5,705,807 | A | 1/1998 | Throngnumchai et al. |
| 6,046,466 | A | 4/2000 | Ishida et al. |
| 6,350,981 | B1 | 2/2002 | Uno |
| 6,512,547 | B1 | 1/2003 | Miida |
| 6,947,102 | B2 | 9/2005 | den Boer et al. |
| 7,002,547 | B2 | 2/2006 | Yamada |
| 7,184,009 | B2 * | 2/2007 | Bergquist ............... 345/90 |
| 2001/0000676 | A1 * | 5/2001 | Zhang et al. ............ 349/12 |
| 2003/0156230 | A1 | 8/2003 | Boer et al. |
| 2003/0218116 | A1 | 11/2003 | Boer |
| 2005/0200296 | A1 | 9/2005 | Naugler et al. |
| 2008/0198140 | A1 | 8/2008 | Kinoshita et al. |
| 2010/0238112 | A1 | 9/2010 | Yamamoto |

FOREIGN PATENT DOCUMENTS

| | | |
|---|---|---|
| JP | 4013360 | 1/1992 |
| JP | 06-011645 | 1/1994 |
| JP | 2000-162041 | 6/2000 |
| JP | 2000330090 | 11/2000 |
| JP | 2006154815 | 6/2006 |
| JP | 2008203507 | 9/2008 |
| JP | 2010244517 | 10/2010 |
| KR | 2001-0004005 | 1/2001 |
| TW | 200743219 | 11/2007 |
| TW | 200805245 | 1/2008 |
| TW | 201020667 | 6/2010 |

OTHER PUBLICATIONS

"Office Action of Taiwan Counterpart Application", issued on Feb. 17, 2014, p. 1-8.

"Office Action of Japan Counterpart Application", issued on Feb. 12, 2014, p. 1-3.

* cited by examiner

INTERACTIVE DISPLAY PANEL HAVING TOUCH-SENSING FUNCTIONS

CROSS-REFERENCE TO RELATED APPLICATION

This application is a continuation in part (CIP) application of and claims the priority benefit of patent application Ser. No. 12/406,337, filed on Mar. 18, 2009. The prior patent application Ser. No. 12/406,337 is a divisional application of and claims the priority benefit of patent application Ser. No. 11/534,680, filed on Sep. 25, 2006, which has been patented as U.S. Pat. No. 7,525,078 on Apr. 28, 2009. The prior patent application Ser. No. 11/534,680 also claims the priority benefit of Taiwan application No. 94135169, filed on Oct. 7, 2005. The entirety of each of the above-mentioned applications is hereby incorporated by reference herein and made a part of this specification.

BACKGROUND OF THE INVENTION

1. Field of the Invention

The present invention generally relates to an interactive display panel. More particularly, the present invention relates to an interactive display panel having touch-sensing function.

2. Description of Related Art

Display panels traditionally serve the role of displaying the information or the output from a system, while other input device or devices provide inputs to the system. Interactive devices, such as a touch panel that can receive a user's input via touching the display panel, combines both output and input functions and allow a user to interact with the display or the system coupled to the display. As an example, devices such as personal digital assistants (PDAs), mobile phones, personal computers (PCs), tablet PCs (PC), etc. have incorporated touch panels for providing users with more choices in providing inputs to or operate a system.

Conventional touch panels or touch screens have a number of different designs, such as resistive type, surface-wave type, capacitive type, and infrared-ray type designs. However, all of these designs typically require combining a display device with a separate touch panel sheet, which may affect the display quality of the display, increase the weight and size of an existing display panel, and, usually unavoidably, significantly increase the manufacturing cost and time of the combined device. In order to decrease the manufacturing cost and time of the combined device, in-cell type touch display panels are developed and manufactured. The above-mentioned in-cell type touch display panel includes a display panel, a plurality of photo-sensors arranged in array, a plurality of scan lines, and a plurality of readout lines. The photo-sensors, the scan lines, and the readout lines are integrated within the display panel. The photo-sensors are suitable for receiving optical signal from an optical stylus. The scan lines and the readout lines are electrically connected with the photo-sensors such that the photo-sensors are sequentially turned on through the scan lines and the photo-current generated from the photo-sensors are transmitted to a touch sensing IC through the readout lines.

Conventionally, in order to receive optical signal from the optical stylus, the photo-sensors integrated within the in-cell type touch display panel are generally located within display regions of sub-pixels. In the conventional pixel design of the in-cell type touch display panel, aperture ratio thereof is significantly reduced because portions of display regions are occupied and blocked by the photo-sensors. Accordingly, aperture ratio of the conventional in-cell type touch display panel is required to be improved.

SUMMARY OF THE INVENTION

As embodied and broadly described herein, the present application provides an interactive display panel includes a plurality of scan lines, a plurality of first data lines, a plurality of sub-pixels, a plurality of photo-sensors and a plurality of second data lines. The plurality of scan lines and the plurality of first data lines are intersected to define a plurality of sub-pixel regions. Each of the sub-pixels is located in one of the sub-pixel regions and has a display region, and each of the sub-pixels is electrically connected with one of the plurality of scan lines and one of the plurality of first data lines respectively. The plurality of photo-sensors are located outside the display regions of the plurality of sub-pixels. The plurality of scan lines and the plurality of second data lines are intersected and electrically connected with the plurality of photo-sensors.

As embodied and broadly described herein, the present application provides an interactive display panel includes a plurality of scan lines, a plurality of first data lines, a plurality of sub-pixels, a plurality of photo-sensors and a plurality of second data lines. The plurality of scan lines and the plurality of first data lines are intersected to define a plurality of sub-pixel regions. Each of the sub-pixels is located in one of the sub-pixel regions and has a display region, and each of the sub-pixels is electrically connected with one of the plurality of scan lines and one of the plurality of first data lines respectively. The plurality of photo-sensors are located outside the display regions of the plurality of sub-pixels, wherein the plurality of scan lines extend along a row direction, the plurality of first data lines extend along a column direction perpendicular to the row direction, the plurality of sub-pixels are arranged in a plurality of sub-pixel rows, the plurality of photo-sensors are arranged in a plurality of photo-sensor rows, every at least two adjacent sub-pixel rows form a pixel row, and the pixel rows and the plurality of photo-sensor rows are arranged alternately along the column direction. The plurality of scan lines and the plurality of second data lines are intersected and electrically connected with the plurality of photo-sensors.

Since the photo-sensors is located outside the display regions of the plurality of sub-pixels, aperture ratio of the interactive display panel of the present application is not significantly affected by the photo-sensors and display quality of the interactive display panel of the present application is good accordingly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
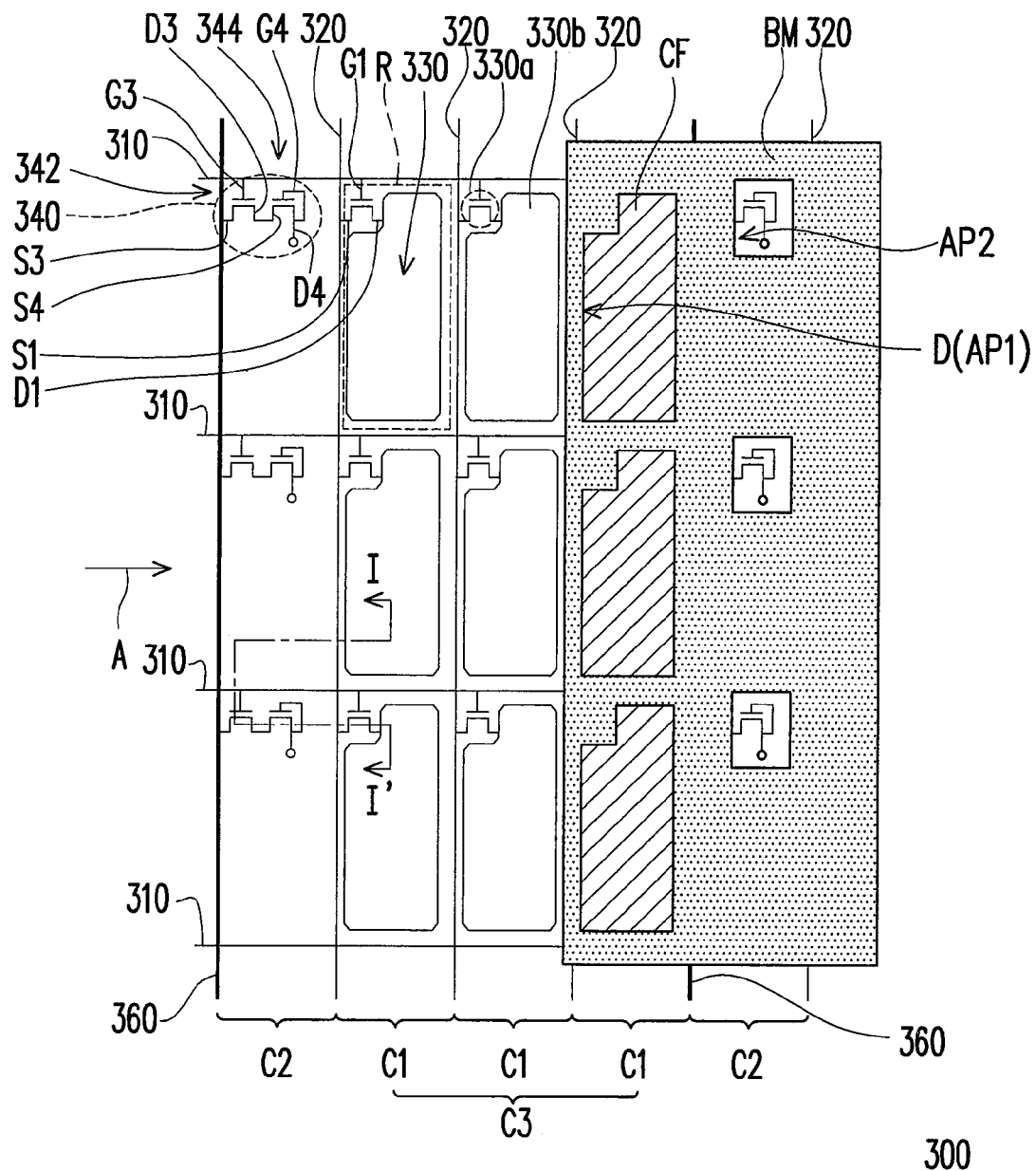
FIG. 1 is a schematic top view showing an interactive display panel according to an embodiment of the present application.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic top view showing an interactive display panel according to an embodiment of the present application. Referring to FIG. 1, the interactive display panel 300 of the embodiment includes a plurality of scan lines 310, a plurality of first data lines 320, a plurality of sub-pixels 330, a plurality of photo-sensors 340, and a plurality of second data lines 360. The plurality of scan lines 310 and the plurality of first data lines 320 are intersected to define a plurality of sub-pixel regions R. Each of the sub-pixels 330 is located in one of the sub-pixel regions R and has a display region D, and each of the sub-pixels 330 is electrically connected with one of the plurality of scan lines 310 and one of the plurality of first data lines 320, respectively. The plurality of photo-sensors 340 are located outside the display regions R of the plurality of sub-pixels 330. The plurality of scan lines 310 and the plurality of second data lines 360 are intersected and electrically connected with the plurality of photo-sensors 340. As an example, the interactive display panel 300 of this embodiment is an in-cell type LCD touch panel, i.e. the sub-pixels 330 are liquid crystal display sub-pixels.

In the interactive display panel 300 of the embodiment, the sub-pixels 330 including red sub-pixels, green sub-pixels and blue sub-pixels arranged in stripe type are illustrated. Other arrangements of sub-pixels 330, such as delta arrangement, or honeycomb arrangement, mosaic arrangement or checkerboard arrangement (R-G-B-W), can also be applied in this application.

Referring to FIG. 1, in this embodiment, the plurality of sub-pixels 330 are arranged in a plurality of sub-pixel columns C1, and the plurality of photo-sensors 340 are arranged in a plurality of photo-sensor columns C2. Every at least two (showing three) adjacent sub-pixel columns C1 form a pixel column C3. The plurality of sub-pixel columns C3 and the plurality of photo-sensor columns C2 are arranged alternately along a row direction A. In other words, the quantity of the plurality of sub-pixels 330 is greater than the quantity of the plurality of photo-sensors 340.

The photo-sensor 340 in FIG. 1 includes a switch transistor 342 and a photo transistor 344. The switch transistor 342 having a gate electrode G3, a drain electrode D3 and a source electrode S3, the gate electrode G3 is electrically connected with one of the plurality of scan lines 310, the drain electrode D3 is electrically connected with the photo transistor 344, the source electrode S3 is electrically connected with one of the plurality of second data lines 360, the photo transistor 344 having a gate electrode G4, a drain electrode D4 and a source electrode S4, the gate electrode G4 is electrically connected with the drain electrode D4, the source electrode S4 is electrically connected with the drain electrode D3 of the switch transistor 342, and the drain electrode D4 is coupled to a reference voltage.

Figure 2:
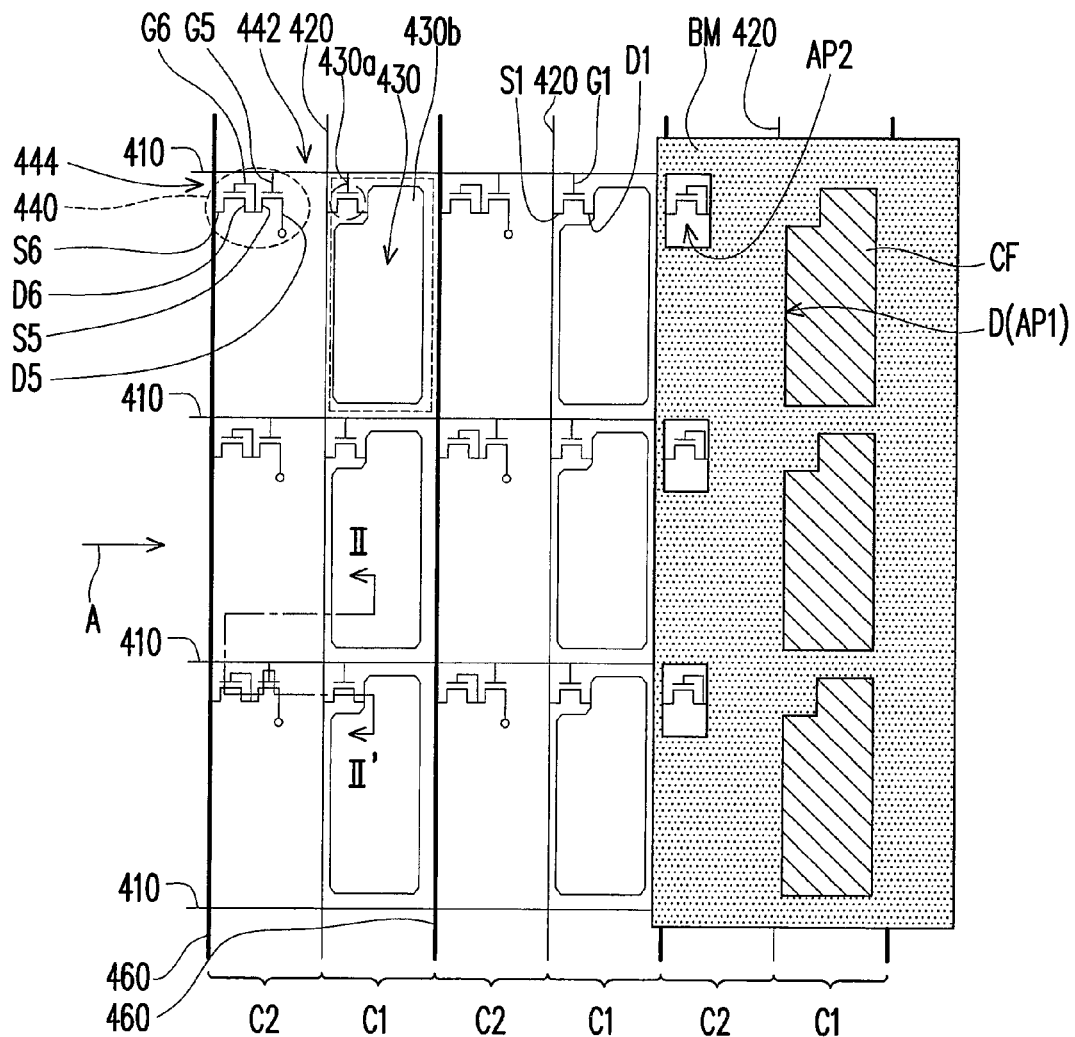
FIG. 2 is a schematic top view showing an interactive display panel according to another embodiment of the present application.

FIG. 2 is a schematic top view showing an interactive display panel according to yet another embodiment of the present application. In FIG. 2, the interactive display panel 400 includes a plurality of scan lines 410, a plurality of first data lines 420, a plurality of sub-pixels 430, a plurality of photo-sensors 440, and a plurality of second data lines 460. The quantity of the plurality of sub-pixels 430 is equal to the quantity of the plurality of photo-sensors 440. The quantity of the plurality of photo-sensors is not limited in this application, and one ordinary skilled in the art can modify the quantity of the plurality of photo-sensors in accordance with actual design requirements.

The photo-sensor 440 in FIG. 2 includes a switch transistor 442 and a photo transistor 444. The switch transistor 442 having a gate electrode G5, a drain electrode D5 and a source electrode S5, the gate electrode G5 is electrically connected with one of the plurality of scan lines 410, the source electrode S5 is electrically connected with the photo transistor 444, the drain electrode D5 is coupled to a reference voltage, the photo transistor 444 having a gate electrode G6, a drain electrode D6 and a source electrode S6, the gate electrode G6 is electrically connected with the drain electrode D6, the drain electrode D6 is electrically connected with the source electrode S5 of the switch transistor 442, and the source electrode S6 is electrically connected with one of the plurality of second data lines 460.

Figure 3A:
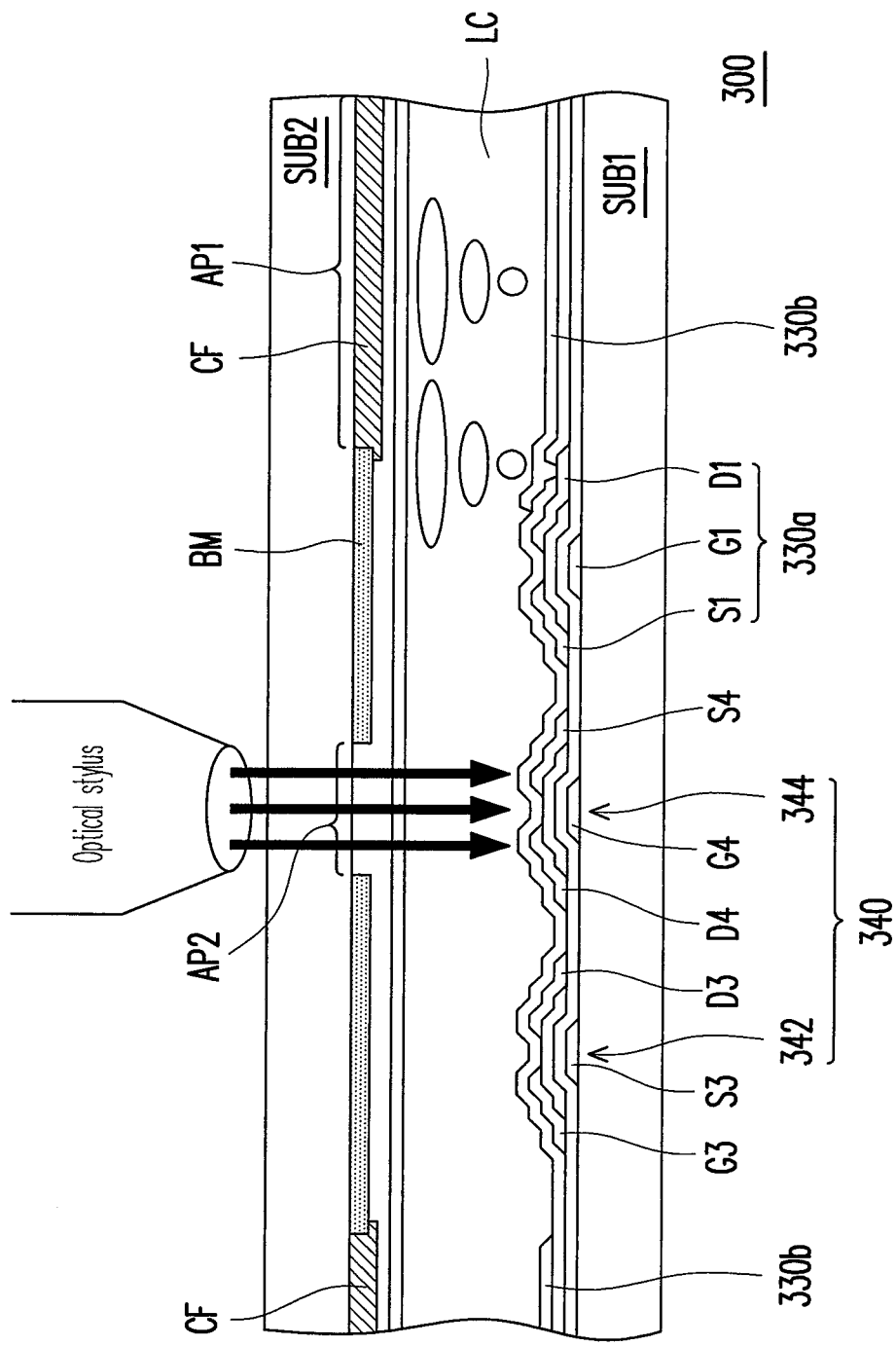
FIG. 3A and FIG. 3B are schematic cross-sectional views taken along the line I-I' illustrating the interactive display panel according to an embodiment of the present application.
Figure 3B:
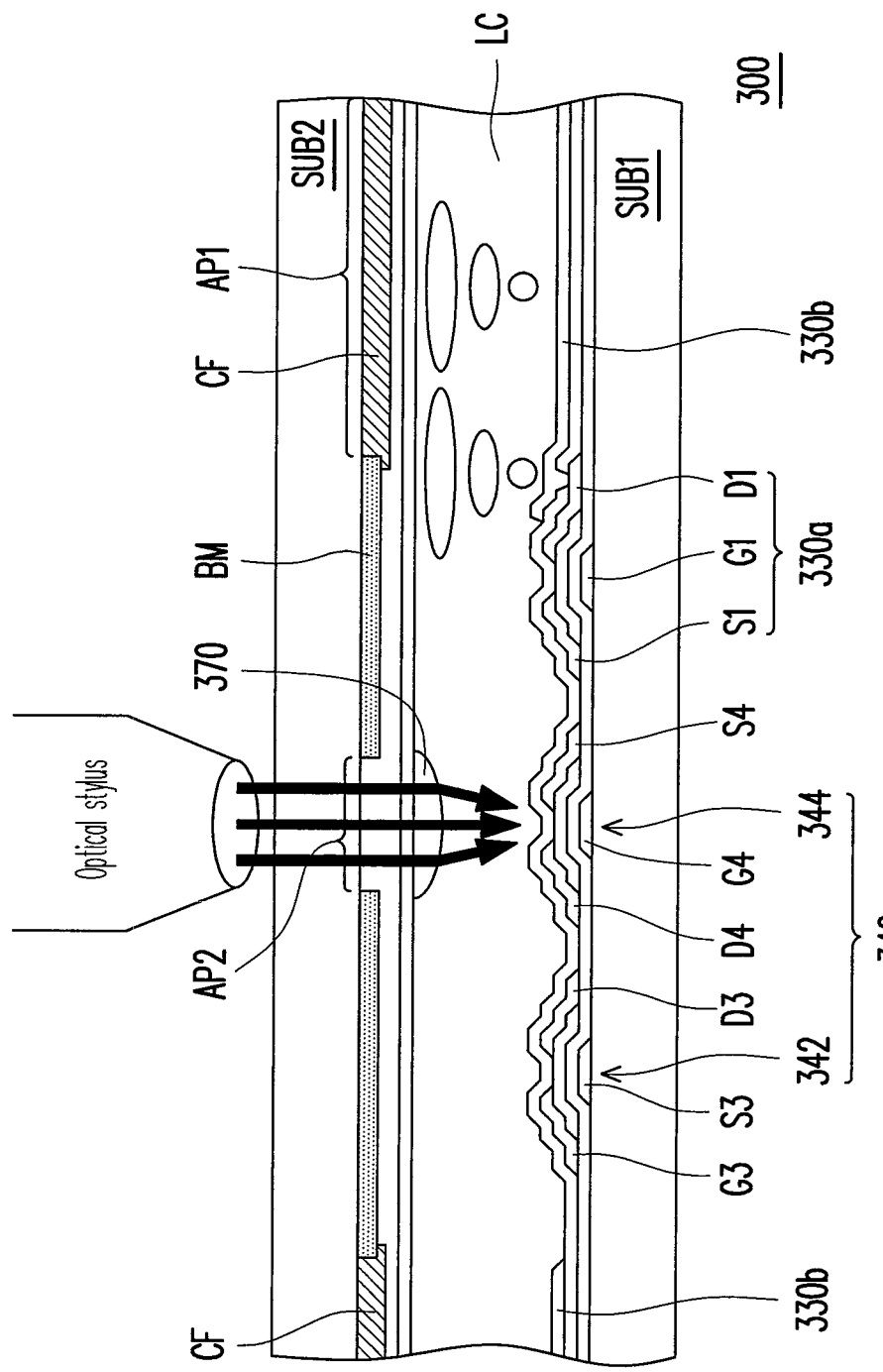

FIG. 3A and FIG. 3B are schematic cross-sectional views taken along the line I-I' illustrating the interactive display panel according to an embodiment of the present application. Referring to FIG. 1 and FIG. 3A, in the in-cell type LCD touch panel of this embodiment, a first substrate SUB1, a second substrate SUB2 disposed above the first substrate SUB1 and a liquid crystal layer LC filled between the first substrate SUB1 and the second substrate SUB2 are required to configure a liquid crystal display cell. Specifically, the plurality of scan lines 310, the plurality of first data lines 320, the plurality of sub-pixels 330, the plurality of photo-sensors 340, and the plurality of second data lines 360 are disposed on the first substrate SUB1. In other words, the first substrate SUB1 having the plurality of scan lines 310, the plurality of first data lines 320, the plurality of sub-pixels 330, the plurality of photo-sensors 340, and the plurality of second data lines 360 may be a thin film transistor array (TFT array) substrate or array substrate having active devices of other types.

Take the above-mentioned TFT array as an example, each of the plurality of sub-pixels 330 disposed on the substrate SUB1 includes a pixel transistor 330a and a pixel electrode 330b. The pixel transistor 330a has a gate electrode G1 electrically connected with one of the plurality of scan lines 310, a source electrode S1 electrically connected with one of the plurality of first data lines 320, and a drain electrode D1. The pixel electrode 330b is electrically connected with the drain electrode D1 of the pixel transistor 330a, and the position of each pixel electrode 330b is corresponding to one of the display region R.

In the present embodiment, each of the photo-sensors 340 is a photo-diode. In a preferred embodiment of the application, each of the photo-sensors 340 is a photo-transistor electrically connected with one of the plurality of second data lines 360 and one of the plurality of scan lines 310. Since the fabrication process and the structure of the photo-transistors are similar and compatible with the process and the structure of the pixel transistor 330a in TFT array, the fabrication costs can be decreased.

In addition, the second substrate SUB2 may be a color filter substrate having a light-shielding layer BM and a plurality of color filters CF thereon. The light-shielding layer BM is disposed on the second substrate SUB2. The light-shielding layer BM has a plurality of first apertures AP1 corresponding to the plurality of display regions R and a plurality of second apertures AP2 corresponding to the photo-sensors 340. The plurality of color filters CF are disposed in the plurality of first apertures AP1. In a preferred embodiment of the application, the light-shielding layer BM is a black matrix having the plurality of first apertures AP1 and the plurality of second apertures AP2, wherein the black matrix may be fabricated from metal, light-shielding resin or the combination thereof. In an alternative embodiment of the application, the light-shielding layer BM may be a stacked layer formed by stacking of at least two color filters.

It is noted that the light-shielding layer BM and the plurality of color filters CF disposed on the second substrate SUB2 are not completely shown in FIG. 1 in order to clearly illustrate elements on the first substrate SUB1. In FIG. 1, the left portion of light-shielding layer BM and the color filters CF are omitted.

Referring to FIG. 3B, the interactive display panel 300 may further include a plurality of lenses 370 corresponding to the second apertures AP2. The lenses 370 are much helpful to condense the light beam emitted from an optical stylus. Accordingly, the sensitivity of the photo-sensors 340 may be enhanced.

Figure 4A:
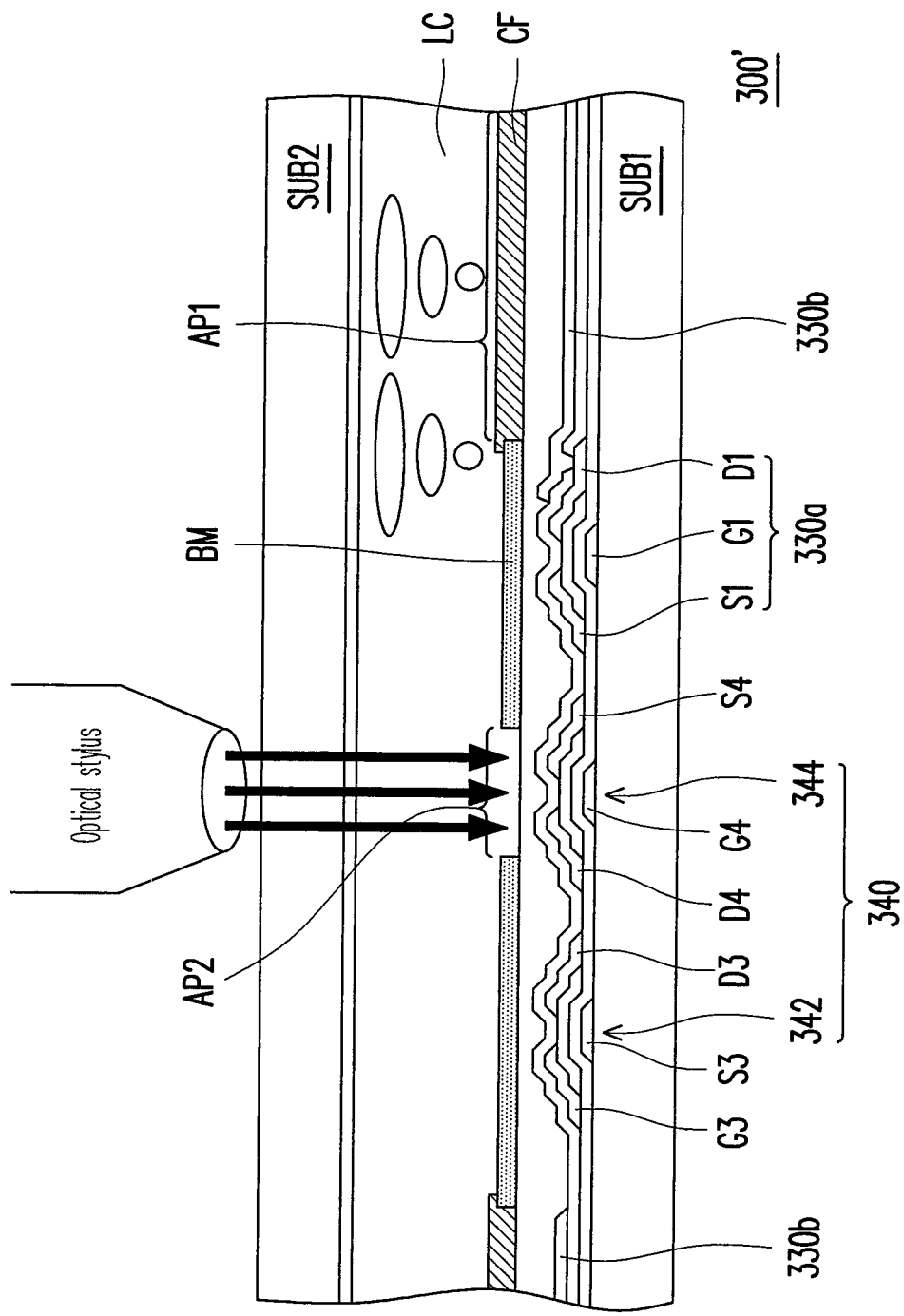
FIG. 4A and FIG. 4B are schematic cross-sectional views illustrating the interactive display panel according to another embodiment of the present application.
Figure 4B:
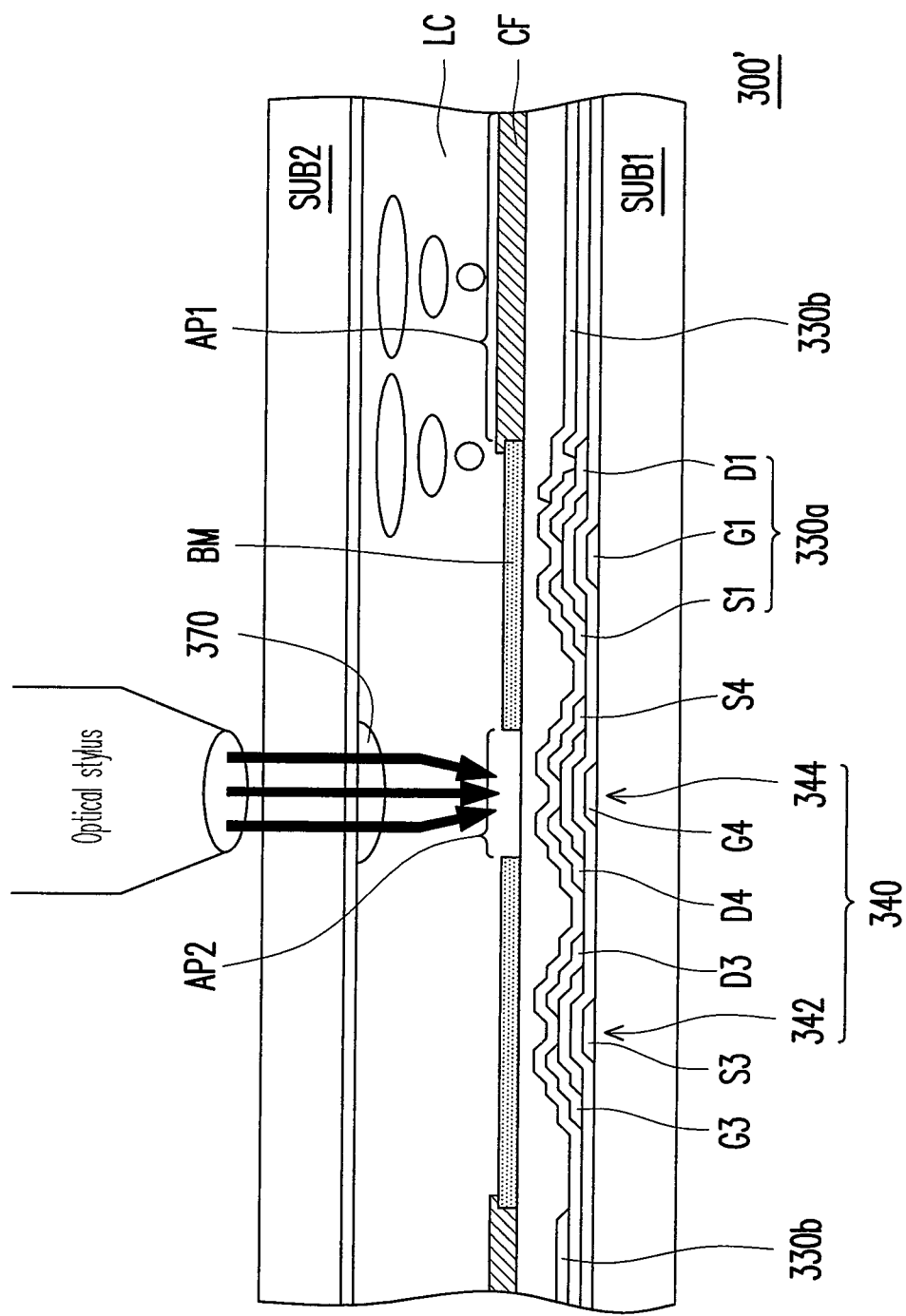

FIG. 4A and FIG. 4B are schematic cross-sectional views illustrating the interactive display panel according to another embodiment of the present application. Referring to FIG. 4A and FIG. 4B, the interactive display panel 300' is similar with the interactive display panel 300 shown in FIG. 3A and FIG. 3B except that the position of the light-shielding layer BM and the plurality of color filters CF are modified because color filter on array (COA) technology are adopted in this embodiment. Specifically, the light-shielding layer BM and the plurality of color filters CF are all disposed on the first substrate SUB1. In this embodiment, since the light-shielding layer BM is disposed over the TFT array, the alignment of the first apertures AP1 and the photo-sensors 340 can be more precisely.

Figure 5A:
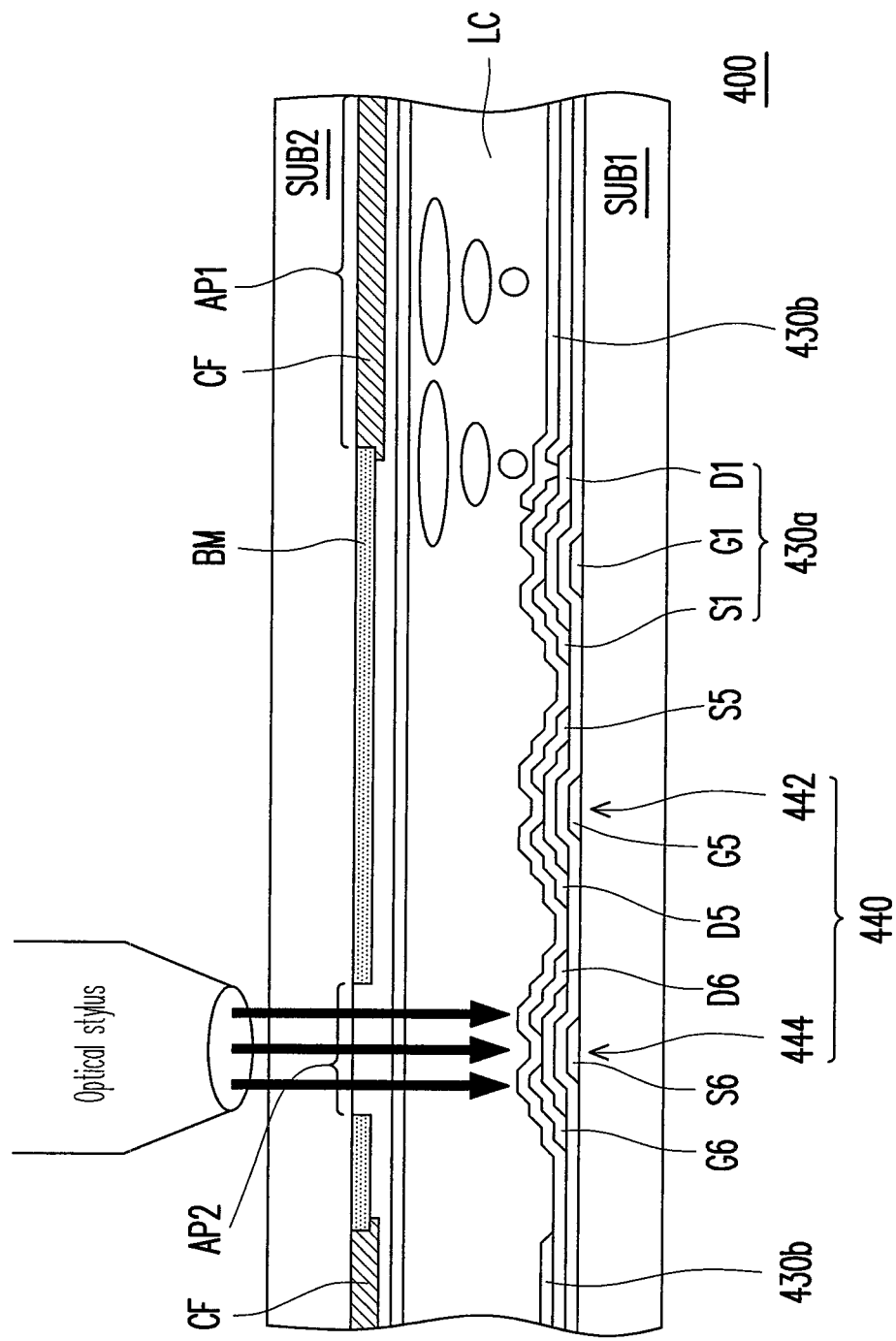
FIG. 5A and FIG. 5B are schematic cross-sectional views taken along the line II-II' illustrating the interactive display panel according to another embodiment of the present application.
Figure 5B:
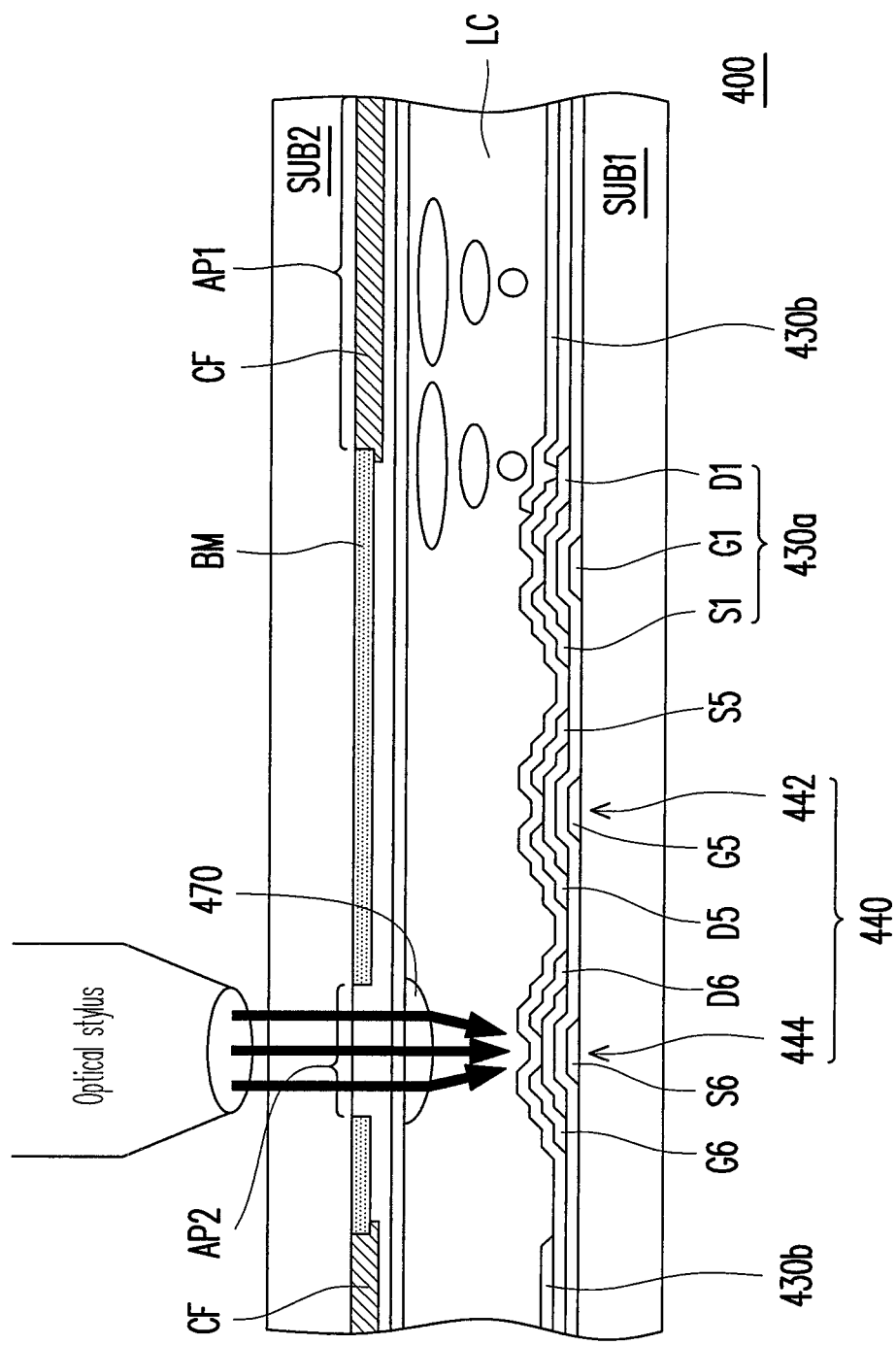

FIG. 5A and FIG. 5B are schematic cross-sectional views taken along the line II-II' illustrating the interactive display panel according to an embodiment of the present application. Referring to FIG. 2 and FIG. 5A, in the in-cell type LCD touch panel of this embodiment, a first substrate SUB1, a second substrate SUB2 disposed above the first substrate SUB1 and a liquid crystal layer LC filled between the first substrate SUB1 and the second substrate SUB2 are required to configure a liquid crystal display cell. Specifically, the plurality of scan lines 410, the plurality of first data lines 420, the plurality of sub-pixels 430, the plurality of photo-sensors 440, and the plurality of second data lines 460 are disposed on the first substrate SUB1. In other words, the first substrate SUB1 having the plurality of scan lines 410, the plurality of first data lines 420, the plurality of sub-pixels 430, the plurality of photo-sensors 440, and the plurality of second data lines 460 may be a thin film transistor array (TFT array) substrate or array substrate having active devices of other types.

Take the above-mentioned TFT array as an example, each of the plurality of sub-pixels 430 disposed on the substrate SUB1 includes a pixel transistor 430a and a pixel electrode 430b. The pixel transistor 430a has a gate electrode G1 electrically connected with one of the plurality of scan lines 410, a source electrode S1 electrically connected with one of the plurality of first data lines 420, and a drain electrode D1. The pixel electrode 430b is electrically connected with the drain electrode D1 of the pixel transistor 430a, and the position of each pixel electrode 430b is corresponding to one of the display region R.

In the present embodiment, each of the photo-sensors 440 is a photo-diode. In a preferred embodiment of the application, each of the photo-sensors 440 is a photo-transistor electrically connected with one of the plurality of second data lines 460 and one of the plurality of scan lines 410. Since the fabrication process and the structure of the photo-transistors are similar and compatible with the process and the structure of the pixel transistor 430a in TFT array, the fabrication costs can be decreased.

In addition, the second substrate SUB2 may be a color filter substrate having a light-shielding layer BM and a plurality of color filters CF thereon. The light-shielding layer BM is disposed on the second substrate SUB2. The light-shielding layer BM has a plurality of first apertures AP1 corresponding to the plurality of display regions R and a plurality of second apertures AP2 corresponding to the photo-sensors 440. The plurality of color filters CF are disposed in the plurality of first apertures AP1. In a preferred embodiment of the application, the light-shielding layer BM is a black matrix having the plurality of first apertures AP1 and the plurality of second apertures AP2, wherein the black matrix may be fabricated from metal, light-shielding resin or the combination thereof. In an alternative embodiment of the application, the light-shielding layer BM may be a stacked layer formed by stacking of at least two color filters.

It is noted that the light-shielding layer BM and the plurality of color filters CF disposed on the second substrate SUB2 are not completely shown in FIG. 2 in order to clearly illustrate elements on the first substrate SUB1. In FIG. 2, the left portion of light-shielding layer BM and the color filters CF are omitted.

Referring to FIG. 5B, the interactive display panel 400 may further include a plurality of lenses 470 corresponding to the second apertures AP2. The lenses 470 are much helpful to condense the light beam emitted from an optical stylus. Accordingly, the sensitivity of the photo-sensors 440 may be enhanced.

Figure 6A:
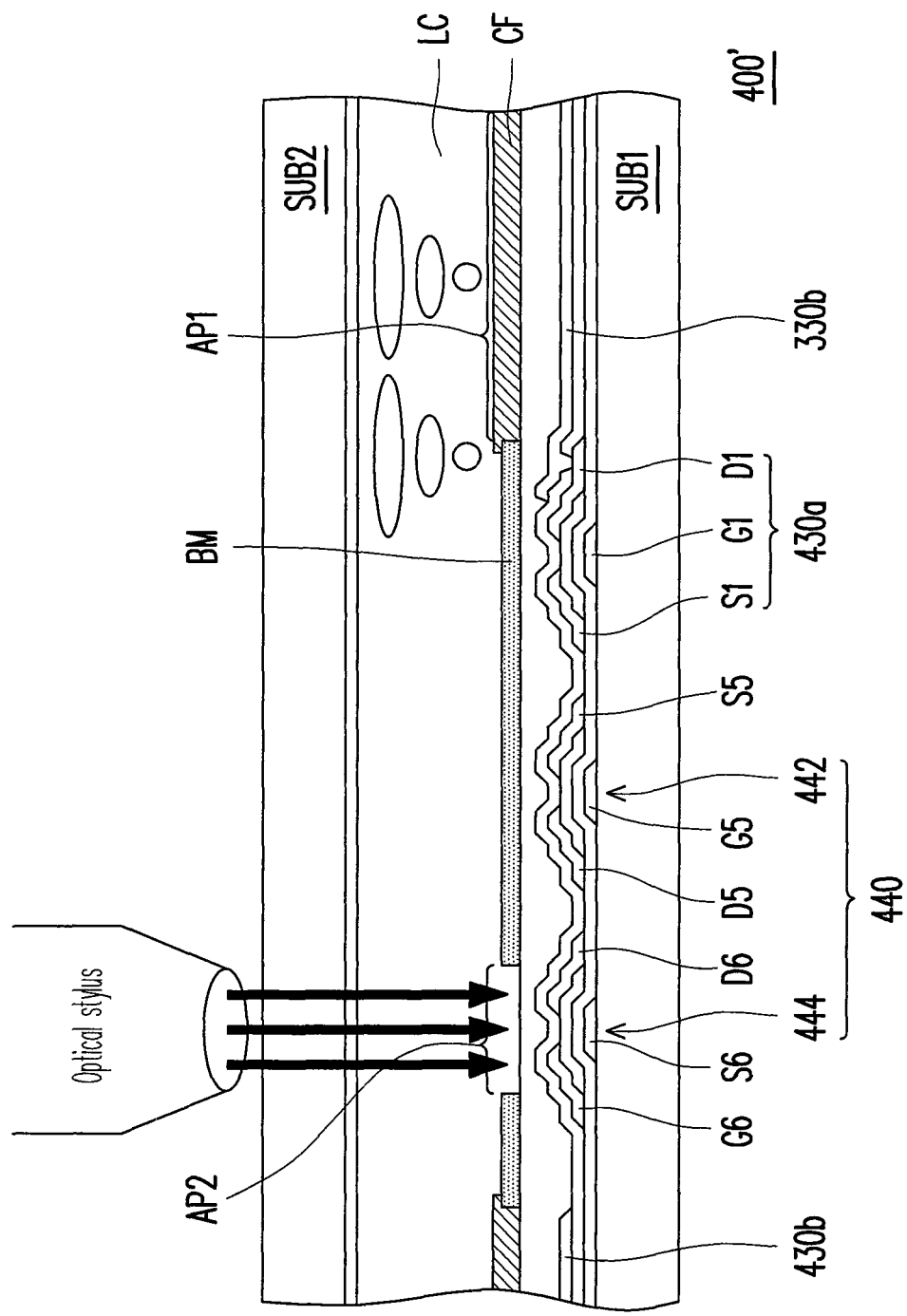
FIG. 6A and FIG. 6B are schematic cross-sectional views illustrating the interactive display panel according to another embodiment of the present application.
Figure 6B:
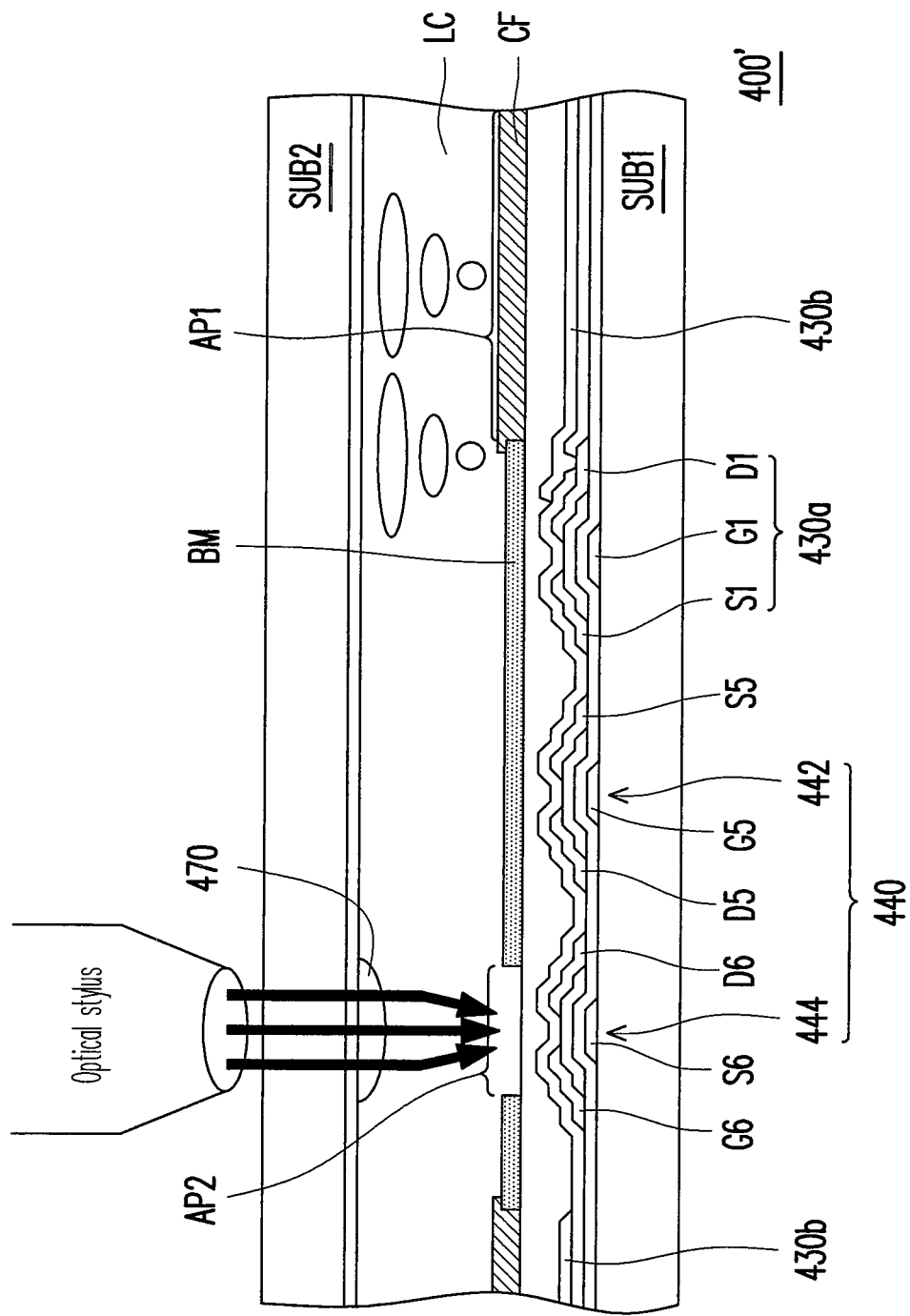

FIG. 6A and FIG. 6B are schematic cross-sectional views illustrating the interactive display panel according to another embodiment of the present application. Referring to FIG. 6A and FIG. 6B, the interactive display panel 400' is similar with the interactive display panel 400 shown in FIG. 5A and FIG. 5B except that the position of the light-shielding layer BM and the plurality of color filters CF are modified because color filter on array (COA) technology are adopted in this embodiment. Specifically, the light-shielding layer BM and the plurality of color filters CF are all disposed on the first substrate SUB1. In this embodiment, since the light-shielding layer BM is disposed over the TFT array, the alignment of the first apertures AP1 and the photo-sensors 440 can be more precisely.

Figure 7A:
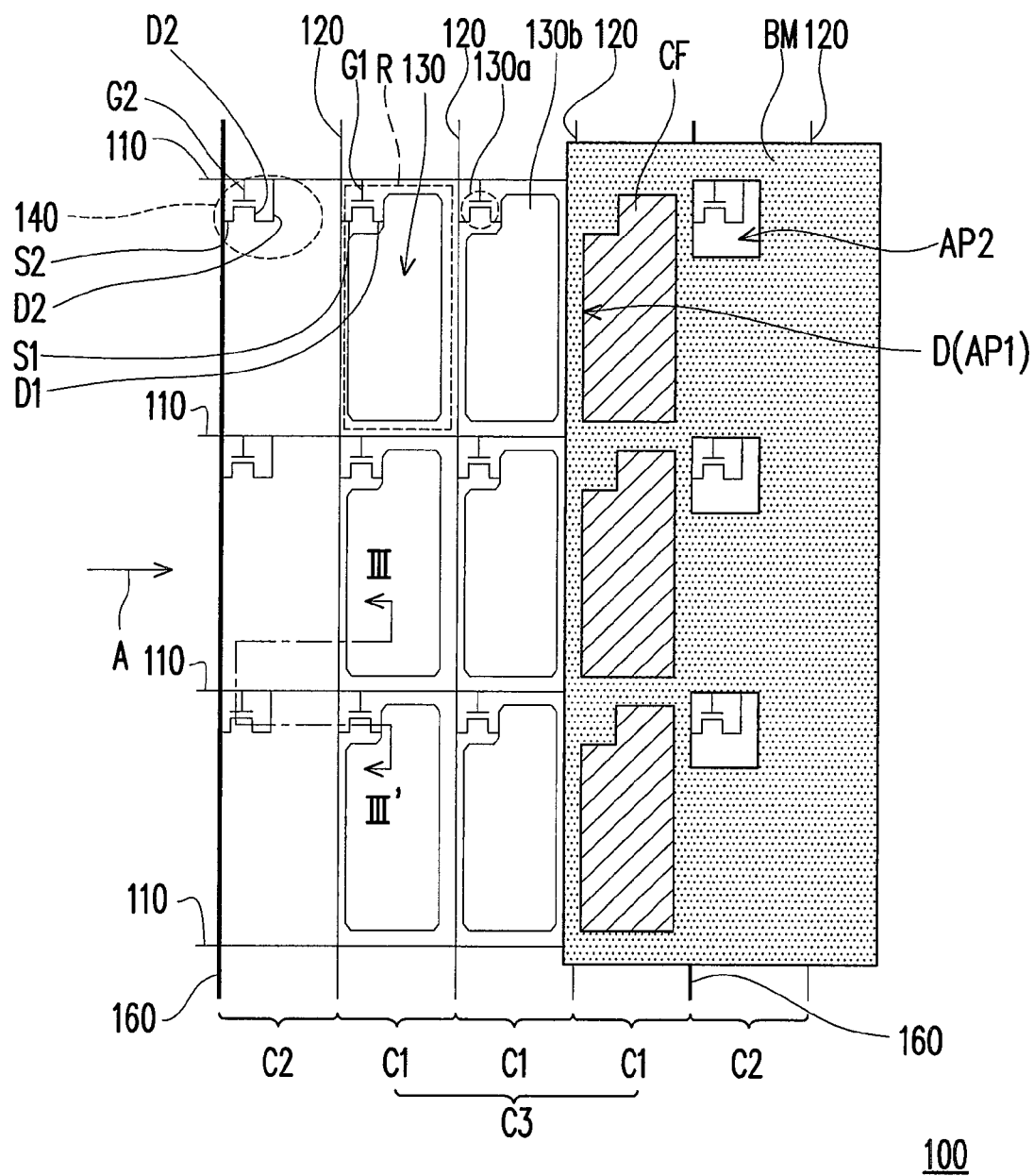
FIG. 7A is a schematic top view showing an interactive display panel according to another embodiment of the present application.

FIG. 7A is a schematic top view showing an interactive display panel according to another embodiment of the present application. Referring to FIG. 7A, the interactive display panel 100 of the embodiment includes a plurality of scan lines 110, a plurality of first data lines 120, a plurality of sub-pixels 130, a plurality of photo-sensors 140, and a plurality of second data lines 160. The plurality of scan lines 110 and the plurality of first data lines 120 are intersected to define a plurality of sub-pixel regions R. Each of the sub-pixels 130 is located in one of the sub-pixel regions R and has a display region D, and each of the sub-pixels 130 is electrically connected with one of the plurality of scan lines 110 and one of the plurality of first data lines 120, respectively. The plurality of photo-sensors 140 are located outside the display regions R of the plurality of sub-pixels 130. The plurality of scan lines 110 and the plurality of second data lines 160 are intersected and electrically connected with the plurality of photo-sensors 140. As an example, the interactive display panel 100 of this embodiment is an in-cell type LCD touch panel, i.e. the sub-pixels 130 are liquid crystal display sub-pixels.

The photo-sensor 140 in FIG. 7A is a photo-transistor having a gate electrode G2, a drain electrode D2, and a source electrode S2 electrically connected with one of the plurality of second data lines 160, the gate electrode G2 and the drain electrode D2 are electrically connected with one of the plurality of scan lines 110.

In the interactive display panel 100 of the embodiment, the sub-pixels 130 including red sub-pixels, green sub-pixels and blue sub-pixels arranged in stripe type are illustrated. Other arrangements of sub-pixels 130, such as delta arrangement, or honeycomb arrangement, mosaic arrangement or checkerboard arrangement (R-G-B-W), can also be applied in this application.

Referring to FIG. 7A, in this embodiment, the plurality of sub-pixels 130 are arranged in a plurality of sub-pixel columns C1, and the plurality of photo-sensors 140 are arranged in a plurality of photo-sensor columns C2. Every at least two (showing three) adjacent sub-pixel columns C1 form a pixel column C3. The plurality of sub-pixel columns C3 and the plurality of photo-sensor columns C2 are arranged alternately along a row direction A. In other words, the quantity of the plurality of sub-pixels 130 is greater than the quantity of the plurality of photo-sensors 140.

Figure 7B:
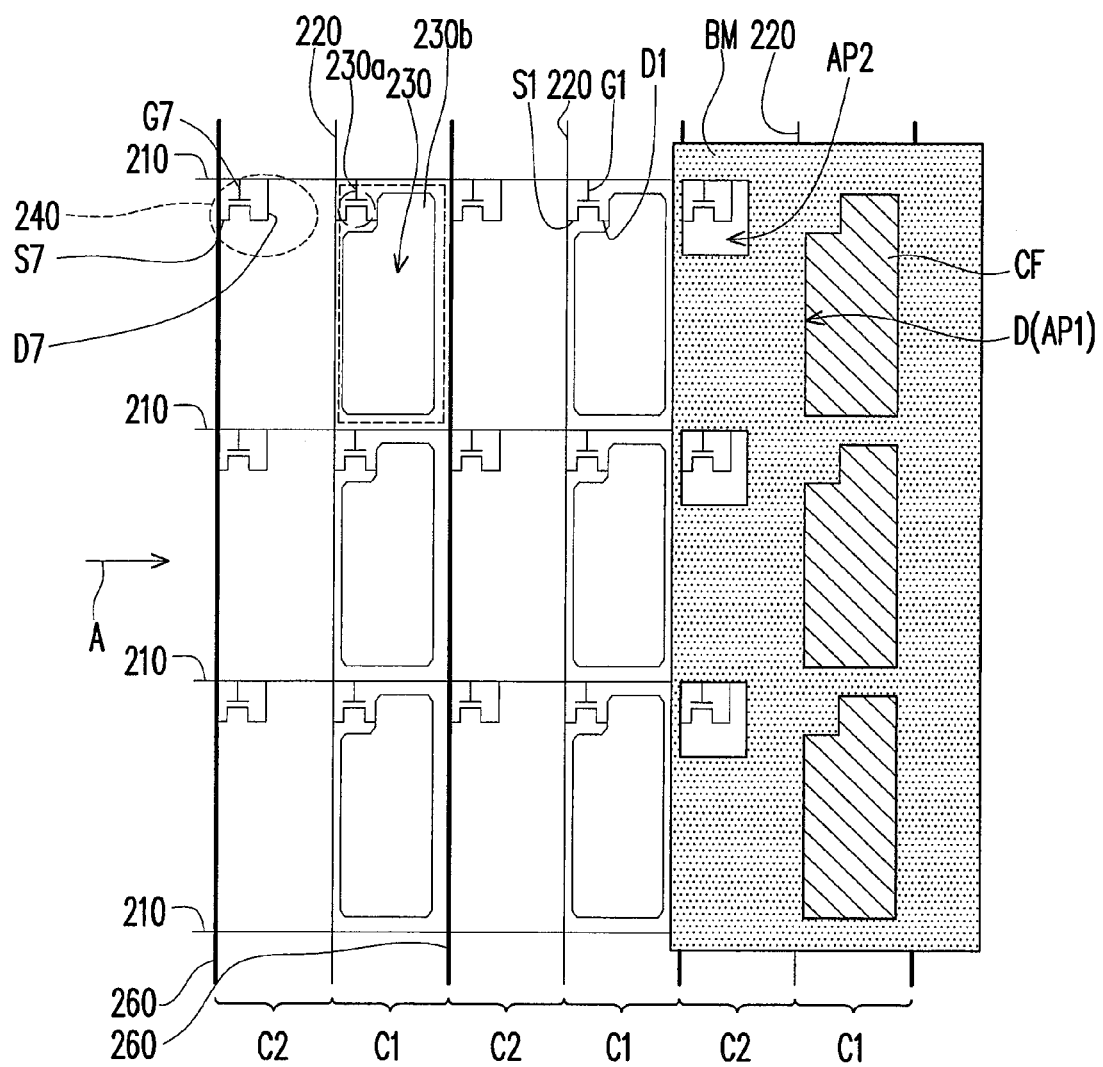
FIG. 7B is a schematic top view showing an interactive display panel according to yet another embodiment of the present application.

FIG. 7B is a schematic top view showing an interactive display panel according to yet another embodiment of the present application. In FIG. 7B, the interactive display panel 200 includes a plurality of scan lines 210, a plurality of first data lines 220, a plurality of sub-pixels 230, a plurality of photo-sensors 240, and a plurality of second data lines 260. The quantity of the plurality of sub-pixels 230 is equal to the quantity of the plurality of photo-sensors 240. The quantity of the plurality of photo-sensors is not limited in this application, and one ordinary skilled in the art can modify the quantity of the plurality of photo-sensors in accordance with actual design requirements.

The photo-sensor 240 in FIG. 7B is a photo-transistor having a gate electrode G7, a drain electrode D7, and a source electrode S7 electrically connected with one of the plurality of second data lines 260, the gate electrode G7 and the drain electrode D7 are electrically connected with one of the plurality of scan lines 210.

Figure 8A:
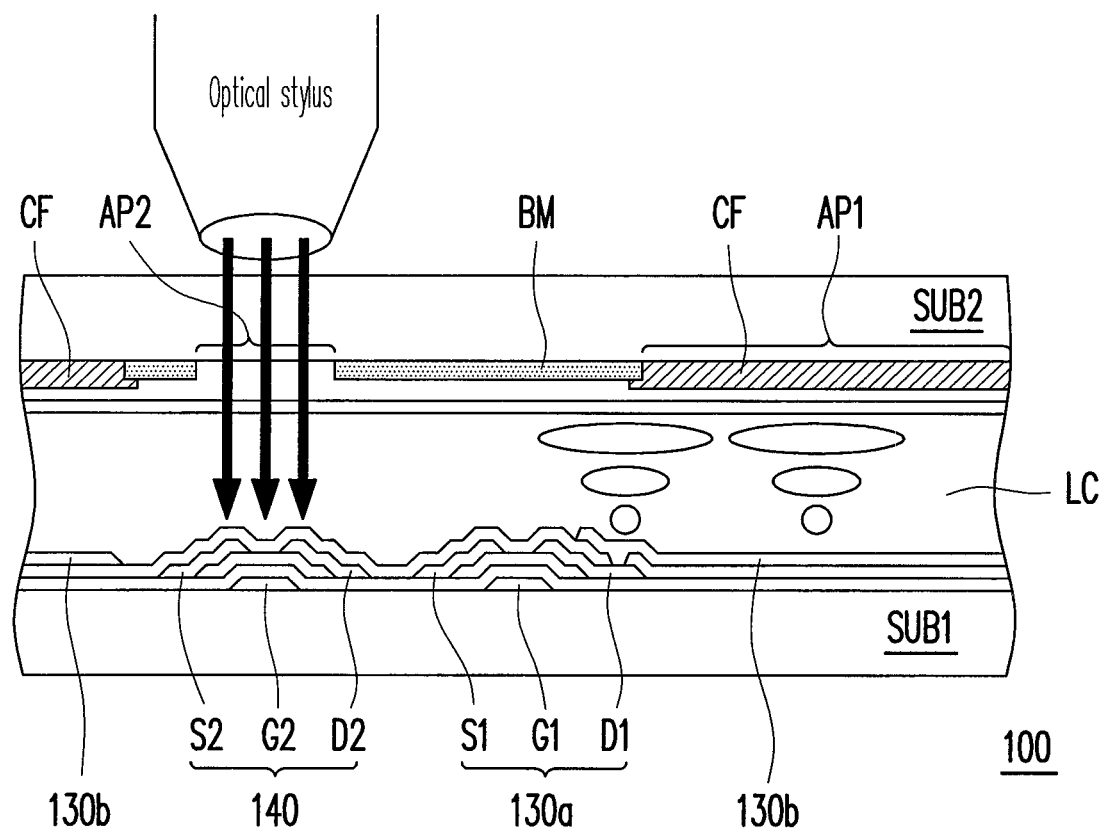
FIG. 8A and FIG. 8B are schematic cross-sectional views taken along the line illustrating the interactive display panel according to another embodiment of the present application.
Figure 8B:
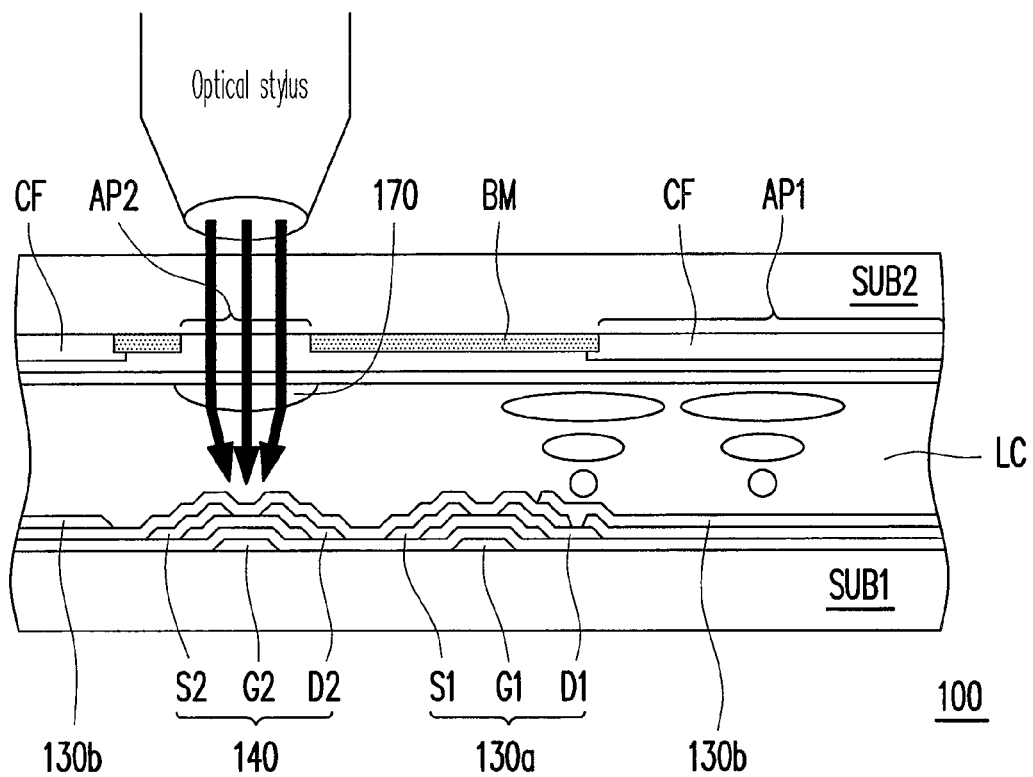

FIG. 8A and FIG. 8B are schematic cross-sectional views taken along the line illustrating the interactive display panel according to an embodiment of the present application.

Referring to FIG. 7A and FIG. 8A, in the in-cell type LCD touch panel of this embodiment, a first substrate SUB1, a second substrate SUB2 disposed above the first substrate SUB1 and a liquid crystal layer LC filled between the first substrate SUB1 and the second substrate SUB2 are required to configure a liquid crystal display cell. Specifically, the plurality of scan lines 110, the plurality of first data lines 120, the plurality of sub-pixels 130, the plurality of photo-sensors 140, and the plurality of second data lines 160 are disposed on the first substrate SUB1. In other words, the first substrate SUB1 having the plurality of scan lines 110, the plurality of first data lines 120, the plurality of sub-pixels 130, the plurality of photo-sensors 140, and the plurality of second data lines 160 may be a thin film transistor array (TFT array) substrate or array substrate having active devices of other types.

Take the above-mentioned TFT array as an example, each of the plurality of sub-pixels 130 disposed on the substrate SUB1 includes a pixel transistor 130a and a pixel electrode 130b. The pixel transistor 130a has a gate electrode G1 electrically connected with one of the plurality of scan lines 110, a source electrode S1 electrically connected with one of the plurality of first data lines 120, and a drain electrode D1. The pixel electrode 130b is electrically connected with the drain electrode D1 of the pixel transistor 130a, and the position of each pixel electrode 130b is corresponding to one of the display region R.

In the present embodiment, each of the photo-sensors 140 is a photo-diode. In a preferred embodiment of the application, each of the photo-sensors 140 is a photo-transistor having a gate electrode G2, a source electrode S2, and a drain electrode D2 electrically connected with one of the plurality of second data lines 160, the gate electrode G2 and the source electrode S2 are electrically connected with one of the plurality of scan lines 110 simultaneously. When the photo-transistor is turned on, the photo-transistor has similar function as a photo-diode since the gate electrode G2 and the source electrode S2 are electrically connected. Since the fabrication process and the structure of the photo-transistors are similar and compatible with the process and the structure of the pixel transistor 130a in TFT array, the fabrication costs can be decreased.

In addition, the second substrate SUB2 may be a color filter substrate having a light-shielding layer BM and a plurality of color filters CF thereon. The light-shielding layer BM is disposed on the second substrate SUB2. The light-shielding layer BM has a plurality of first apertures AP1 corresponding to the plurality of display regions R and a plurality of second apertures AP2 corresponding to the photo-sensors 140. The plurality of color filters CF are disposed in the plurality of first apertures AP1. In a preferred embodiment of the application, the light-shielding layer BM is a black matrix having the plurality of first apertures AP1 and the plurality of second apertures AP2, wherein the black matrix may be fabricated from metal, light-shielding resin or the combination thereof. In an alternative embodiment of the application, the light-shielding layer BM may be a stacked layer formed by stacking of at least two color filters.

It is noted that the light-shielding layer BM and the plurality of color filters CF disposed on the second substrate SUB2 are not completely shown in FIG. 7 in order to clearly illustrate elements on the first substrate SUB1. In FIG. 7, the left portion of light-shielding layer BM and the color filters CF are omitted.

Referring to FIG. 8B, the interactive display panel 100 may further include a plurality of lenses 170 corresponding to the second apertures AP2. The lenses 170 are much helpful to condense the light beam emitted from an optical stylus. Accordingly, the sensitivity of the photo-sensors 140 may be enhanced.

Figure 9A:
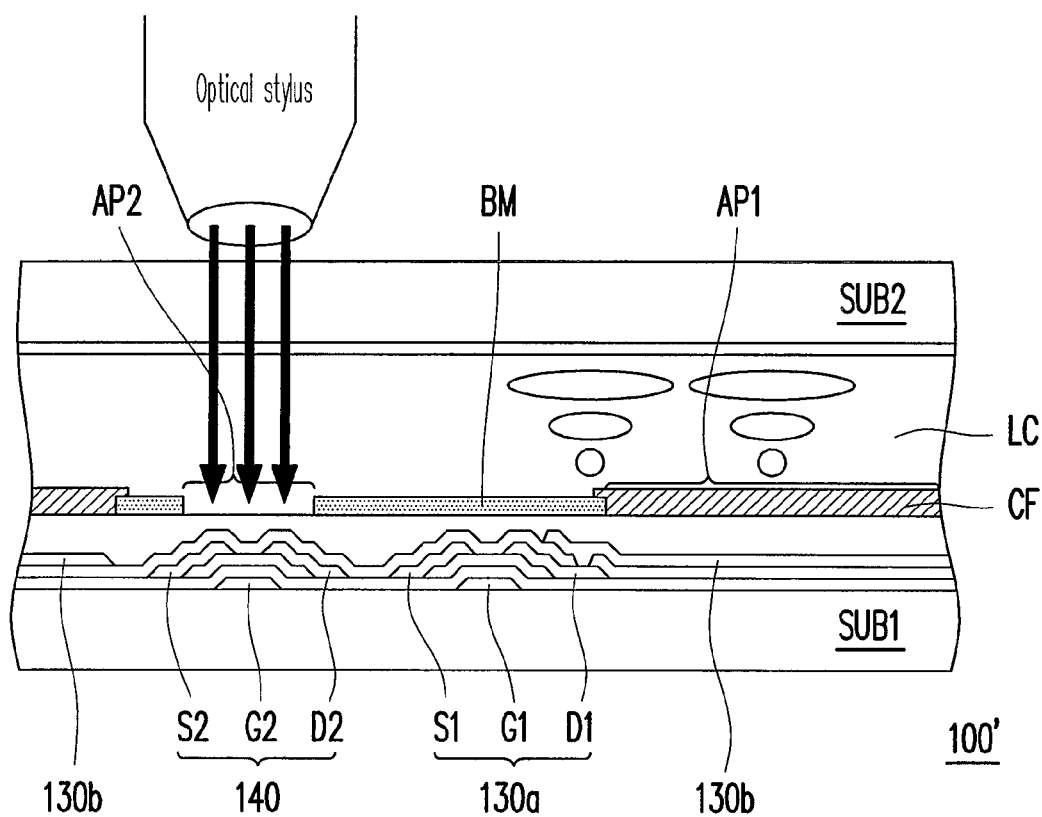
FIG. 9A and FIG. 9B are schematic cross-sectional views illustrating the interactive display panel according to another embodiment of the present application.
Figure 9B:
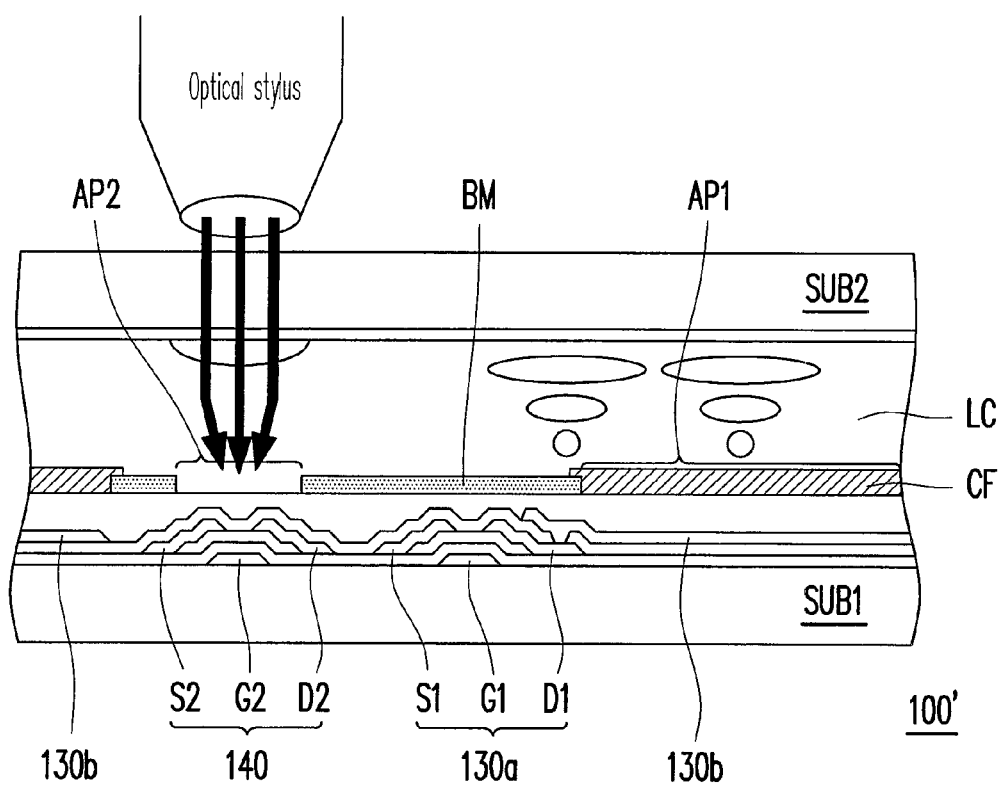

FIG. 9A and FIG. 9B are schematic cross-sectional views illustrating the interactive display panel according to another embodiment of the present application. Referring to FIG. 9A and FIG. 9B, the interactive display panel 100' is similar with the interactive display panel 100 shown in FIG. 8A and FIG. 8B except that the position of the light-shielding layer BM and the plurality of color filters CF are modified because color filter on array (COA) technology are adopted in this embodiment. Specifically, the light-shielding layer BM and the plurality of color filters CF are all disposed on the first substrate SUB1. In this embodiment, since the light-shielding layer BM is disposed over the TFT array, the alignment of the first apertures AP1 and the photo-sensors 140 can be more precisely.

The type of photo-sensors is not limited in this application. In some embodiments, the type of the photo-sensors 140 in FIG. 7 can be applied in FIG. 1 and FIG. 2, the type of photo-sensors 340 in FIG. 1 can be applied in FIG. 7 and FIG. 2, and the type of photo-sensors 440 in FIG. 2 can be applied in FIG. 7 and FIG. 1.

Since the display regions of the plurality of sub-pixels are not occupied by the photo-sensors, aperture ratio of the interactive display panel of the present application is not significantly affected by the photo-sensors. Accordingly, display quality of the interactive display panel of the present application is good. Furthermore, the first data lines and the second data lines recited in the above embodiment can be formed of the same material in a same process of film deposition, photolithography and etching. And the photo sensor and the pixel transistor are also formed in the same process. Therefore, the present invention does not need an additional process to achieve the input function, compared with the standard display fabrication such as thin film transistor liquid crystal display (TFT-LCD).

In above embodiment, the any type of the transistors is a bottom gate thin film transistor for illustration, but it is not limited in the present invention. It should be appreciated by those skilled in the art that the source electrode and the drain electrode in the TFT are interchangeable.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interactive display panel comprising:
   a plurality of scan lines;
   a plurality of first data line, wherein adjacent scan lines and adjacent first data lines are intersected to define a sub-pixel region;
   a plurality of sub-pixels, each of the sub-pixels being located in one of the sub-pixel regions and electrically connected with one of the plurality of scan lines and one of the plurality of first data lines respectively;
   a plurality of photo-sensors located outside the sub-pixel region; and
   a plurality of second data lines, the plurality of scan lines and the plurality of second data lines being intersected and electrically connected with the plurality of photo-sensors
   wherein the photo-sensors comprise a switch transistor and a photo transistor,
   wherein the switch transistor has a first gate electrode, a first drain electrode and a first source electrode, the first gate electrode being electrically connected with one of the plurality of scan lines, the first drain electrode being electrically connected with the photo transistor, the first source electrode being electrically connected with one of the plurality of second data lines,
   and wherein the photo transistor has a second gate electrode, a second drain electrode and a second source electrode, the second gate electrode being electrically connected with second drain electrode, the second source electrode being electrically connected with the first drain electrode of the switch transistor, and the second drain electrode being coupled to a reference voltage.

2. The interactive display panel according to claim 1, wherein the sub-pixel region comprises a display region.

3. The interactive display panel according to claim 2 further comprising:
   a first substrate;
   a second substrate disposed above the first substrate, wherein the plurality of scan lines, the plurality of first data lines, the plurality of sub-pixels, the plurality of photo-sensors, and the plurality of second data lines are disposed on the first substrate; and
   a liquid crystal layer filled between the first substrate and the second substrate.

4. The interactive display panel according to claim 3 further comprising:
   a light-shielding layer disposed on the second substrate, the light-shielding layer having a plurality of first apertures corresponding to the plurality of display regions and a plurality of second apertures corresponding to the photo-sensors; and
   a plurality of color filters disposed in the plurality of first apertures.

5. The interactive display panel according to claim 4, wherein the light-shielding layer is a black matrix having the plurality of first apertures and the plurality of second apertures.

6. The interactive display panel according to claim 4 further comprising a plurality of lenses corresponding to the second apertures.

7. The interactive display panel according to claim 3 further comprising:
   a light-shielding layer disposed on the first substrate, the light-shielding layer having a plurality of first apertures corresponding to the plurality of display regions and a plurality of second apertures corresponding to the photo-sensors; and
   a plurality of color filters disposed in the plurality of first apertures.

8. The interactive display panel according to claim 7, wherein the light-shielding layer is a black matrix having the plurality of first apertures and the plurality of second apertures.

9. The interactive display panel according to claim 7 further comprising a plurality of lenses corresponding to the second apertures.

10. The interactive display panel according to claim 2, wherein each of the plurality of sub-pixels comprises:
    a pixel transistor having a gate electrode electrically connected with one of the plurality of scan lines, a source electrode electrically connected with one of the plurality of first data lines, and a drain electrode; and a pixel electrode electrically connected with the drain electrode of the transistor, and the pixel electrode corresponding to the display region.

11. The interactive display panel according to claim 1, wherein the plurality of scan lines extend along a row direction, and the plurality of first data lines extend along a column direction perpendicular to the row direction.

12. The interactive display panel according to claim 11, wherein the plurality of sub-pixels are arranged in a plurality of sub-pixel columns, the plurality of photo-sensors are arranged in a plurality of photo-sensor columns, the plurality of sub-pixel columns and the plurality of photo-sensor columns are arranged alternately along the row direction.

13. The interactive display panel according to claim 12, wherein the first data lines and the second data lines are formed of the same process.

14. The interactive display panel according to claim 12, wherein the quantity of the sub-pixels in each sub-pixel row is greater than the quantity of the photo-sensors in each photo-sensor row.

15. The interactive display panel according to claim 1, wherein the photo-sensor is located between the adjacent first data line and the second data line.

16. An interactive display panel comprising:
a plurality of scan lines;
a plurality of first data lines, wherein adjacent scan lines and adjacent first data lines are intersected to define a first sub-pixel region;
a plurality of sub-pixels, each of the sub-pixels being located in one of the first sub-pixel regions and electrically connected with one of the plurality of scan lines and one of the plurality of first data lines respectively;
a plurality of second data lines, wherein two adjacent scan lines and two adjacent first data line and the second data line are intersected to define a second sub-pixel region; and
a plurality of photo-sensors, each of the photo-sensors located in the second sub-pixel region and electrically connected with one of the plurality of scan lines and one of the plurality of second data lines respectively
wherein the photo-sensors comprise a switch transistor and a photo transistor,
wherein the switch transistor has a first gate electrode, a first drain electrode and a first source electrode, the first gate electrode being electrically connected with one of the plurality of scan lines, the first drain electrode being electrically connected with the photo transistor, the first source electrode being electrically connected with one of the plurality of second data lines,
and wherein the photo transistor has a second gate electrode, a second drain electrode and a second source electrode, the second gate electrode being electrically connected with second drain electrode, the second source electrode being electrically connected with the first drain electrode of the switch transistor, and the second drain electrode being coupled to a reference voltage.

\* \* \* \* \*